United States Patent [19]

Kwon

[11] Patent Number: 5,798,977
[45] Date of Patent: Aug. 25, 1998

[54] POWER LINE COUPLING PREVENTION CIRCUIT FOR SEMICONDUCTOR MEMORY DEVICE

[75] Inventor: Jung Tae Kwon, Kyoungki-do, Rep. of Korea

[73] Assignee: Hyundai Electronics Industries Co., Ltd., Ichon, Rep. of Korea

[21] Appl. No.: 742,681

[22] Filed: Oct. 31, 1996

[30] Foreign Application Priority Data

Nov. 1, 1995 [KR] Rep. of Korea ............. 95-39163

[51] Int. Cl.⁶ .................................................. G11C 7/02
[52] U.S. Cl. ................................. 365/226; 365/206
[58] Field of Search ............................ 365/226, 51, 63, 365/206, 214; 361/56, 111

[56] References Cited

U.S. PATENT DOCUMENTS

| | | | |
|---|---|---|---|
| 5,173,875 | 12/1992 | Komatsu | 365/189.01 |
| 5,280,450 | 1/1994 | Nakagome et al. | 365/189.03 |
| 5,287,241 | 2/1994 | Puar | 361/56 |
| 5,396,454 | 3/1995 | Nowak | 365/154 |
| 5,535,152 | 7/1996 | Han | 365/51 |
| 5,596,474 | 1/1997 | Wada | 361/111 |

Primary Examiner—David C. Nelms
Assistant Examiner—Son Mai
Attorney, Agent, or Firm—Reid & Priest LLP

[57] ABSTRACT

A power line coupling prevention circuit for a semiconductor memory device which has a plurality of memory cell arrays and supply and ground voltage lines formed between adjacent ones of the memory cell arrays. The power line coupling prevention circuit comprises a capacitor formed between the supply and ground voltage lines, and a switching device connected to the capacitor, for making the capacitor conductive. The switching device is operated in response to a data output buffer enable control signal. The capacitor has one side connected to one of the supply and ground voltage lines and the other side connected to the switching device. The switching device is adapted to control the connection of the capacitor between the supply and ground voltage lines in a read operation. Therefore, a voltage level on the ground voltage line can be prevented from increasing due to the coupling between the supply and ground voltage lines

11 Claims, 3 Drawing Sheets

POWER LINE COUPLING PREVENTION CIRCUIT FOR SEMICONDUCTOR MEMORY DEVICE

BACKGROUND OF THE INVENTION

1. Field of the Invention

The present invention relates in general to power line coupling prevention circuits for semiconductor memory devices, and more particularly to a power line coupling prevention circuit which is capable of preventing a voltage level on a ground voltage line from being increased in a read operation.

2. Description of the Prior Art

FIG. 1 is a circuit diagram illustrating the construction of, a conventional power line coupling prevention circuit for a semiconductor memory device. As shown in this drawing, the conventional power line coupling prevention circuit comprises four NMOS transistors MN1–MN4 acting as capacitors. Each of the NMOS transistors MN1–MN4 is connected between a supply voltage line Vcc and a ground voltage line Ves. Although the power line coupling Prevention circuit has comprised four capacitors for the illustrative purpose, it will actually comprise much more capacitors on the chip. The NMOS transistors MN1–MN4 function to maintain a voltage difference between the supply and ground voltage lines Vcc and vss constant in the chip although noise is produced on the supply and ground voltage lines Vcc and vss. However, in read read cycle, voltage levels on the ground voltage line Vss in and outside the chip have a large difference therebetween, whereas the voltage difference between the supply and ground voltage lines Vcc and Vss is maintained constant in the chip. For this reason, read "0" data has a bad voltage level $V_{OL}$.

SUMMARY OF THE INVENTION

Therefore, the present invention has been made in view of the above problem, and it is an object of the present invention to provide a power line coupling prevention circuit for a semiconductor memory device which is capable of preventing a voltage-level on a ground voltage line from being increased in a read operation.

In accordance with the present invention, the above and other objects can be accomplished by a provision of a power line coupling prevention circuit for a semiconductor memory device-which has a plurality of memory cell arrays and first and second voltage lines formed between adjacent ones of the memory cell arrays, comprising capacitive means formed between the first and second voltage line and switching means connected to the capacitive means, for, making the capacitive means conductive.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
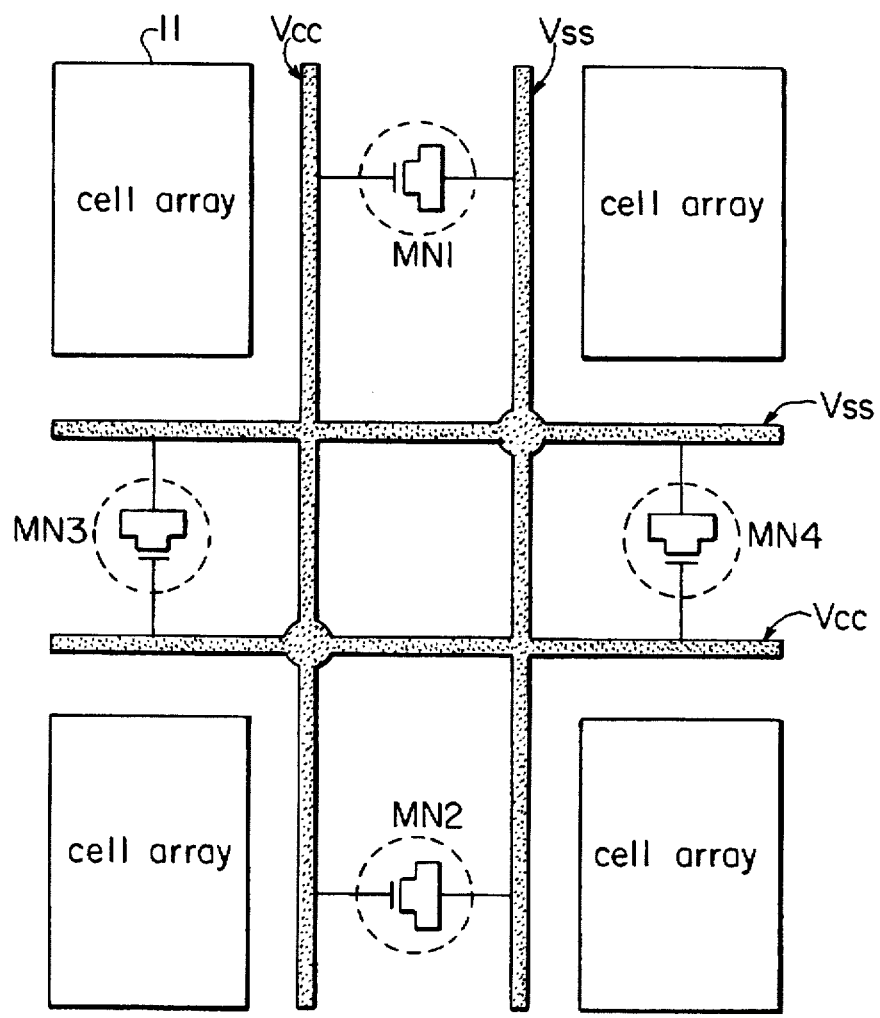
FIG. 1 is a circuit diagram illustrating the construction of a conventional power line coupling prevention circuit for a semiconductor memory device.
Figure 2:
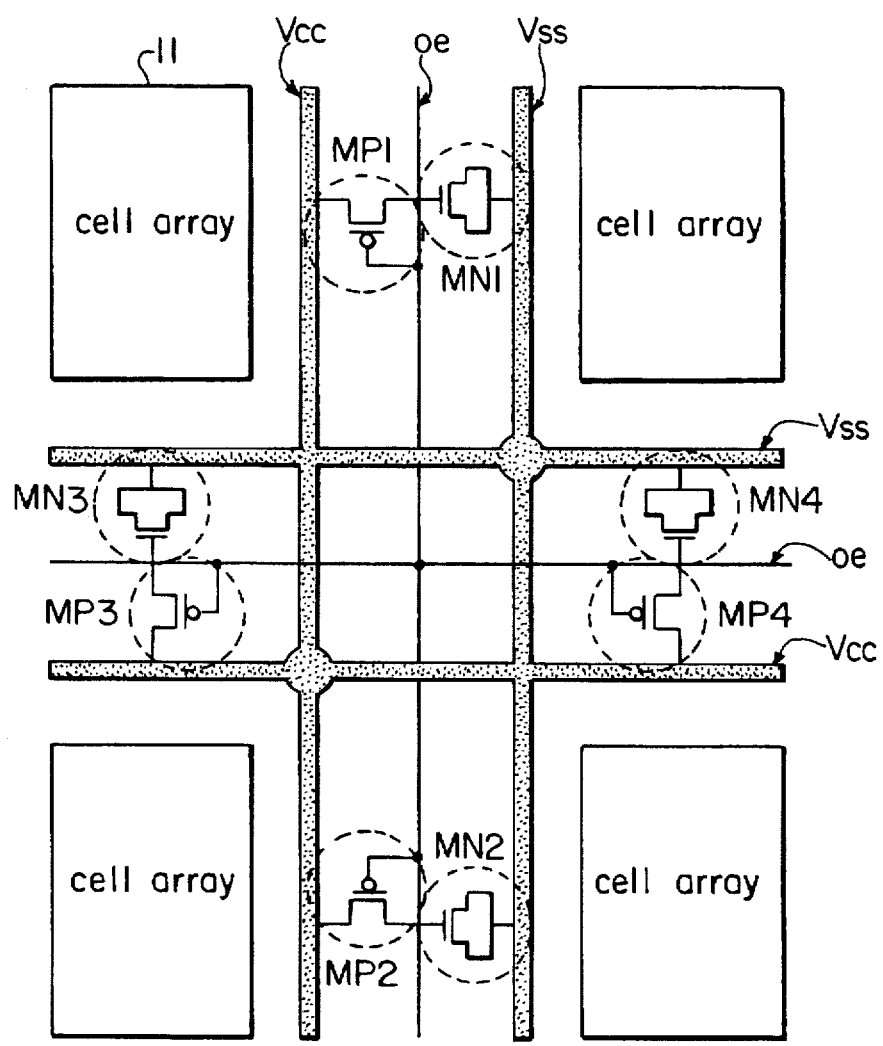
FIG. 2 is a circuit diagram illustrating the construction or a power line coupling prevention circuit for a semiconductor memory device in accordance with an embodiment of the present invention.

FIG. 2 is a circuit diagram illustrating the construction of a power line coupling prevention circuit for a semiconductor memory device in accordance with an embodiment of the present invention. As shown in this drawing, the power line coupling prevention circuit comprises four NMOS transistors MN1–MN4 acting as capacitors. Each of the NMOS transistors MN1–MN4 is selectively connected between a supply voltage line Vcc and a ground voltage line Vcc. Tho power line coupling prevention circuit further comprises four PMOS transistors MP1–MP4 acting as switching devices. Each of the PMOS transistors MP1–MP4 is connected between a gate of one of the corresponding NMOS transistors MN1–MN4 and the supply voltage line Vcc. The PMOS transistors MP1–MP4 have their gates connected in common to a control signal input line for inputting a data output buffer enable control signal oe. Alternatively, a gate control signal to the PMOS transistors MP1–MP4 may be separated from the data output buffer enable control signal oe to prevent the chip access time from being influenced by an increase in parasitic load on the control signal input line connected to the gates of the PMOS transistors MP1–MP4. Although the power line coupling prevention circuit of the present invention has comprised four capacitors and four switching devices for the illustrative purpose, it will actually comprise many more capacitors and switching devices on the chip.

The operation of the power line coupling prevention circuit for the semiconductor memory device with the above-mentioned construction in accordance with an embodiment of the present invention will hereinafter be described in detail.

In the case where a data output buffer is disabled, the data output buffer enable control signal oe has a voltage level on the ground voltage line Vss. In this case, the PMOS transistors MP1–MP4 are turned on to connect the gates of the NMOS transistors MN1–MN4 to the supply voltage line Vcc, respectively. When the data output buffer enable control signal oe is changed from the voltage level on the ground voltage line Vss to a voltage level on the supply voltage line Vcc to enable the data output buffer, the PMOS transistors MP1–MP4 are turned off to disconnect the gates of the NMOS transistors MN1–MN4 from the supply voltage line Vcc, respectively, resulting in the presence of no coupling between the supply voltage line Vcc and the ground voltage line VBs. As a result, because any noise on the supply voltage line Vcc is not transferred to the ground voltage line VBs when the. dAta input buffer performs a read "1" operation, the voltage level on the ground voltage line Vss is prevented from being increased when the data output buffer performs a read "0" operation.

In this manner, the data output buffer enable control signal oe or another control signal is used to control the capacitor connection between the supply voltage line Vcc and the ground voltage line Vss to prevent the voltage level on the ground voltage line Vss from being increased due to the coupling between the supply voltage line vcc and the ground voltage line Vss in the read operation. Therefore, a lower voltage level $V_{OL}$ can be obtained.

Figure 3:
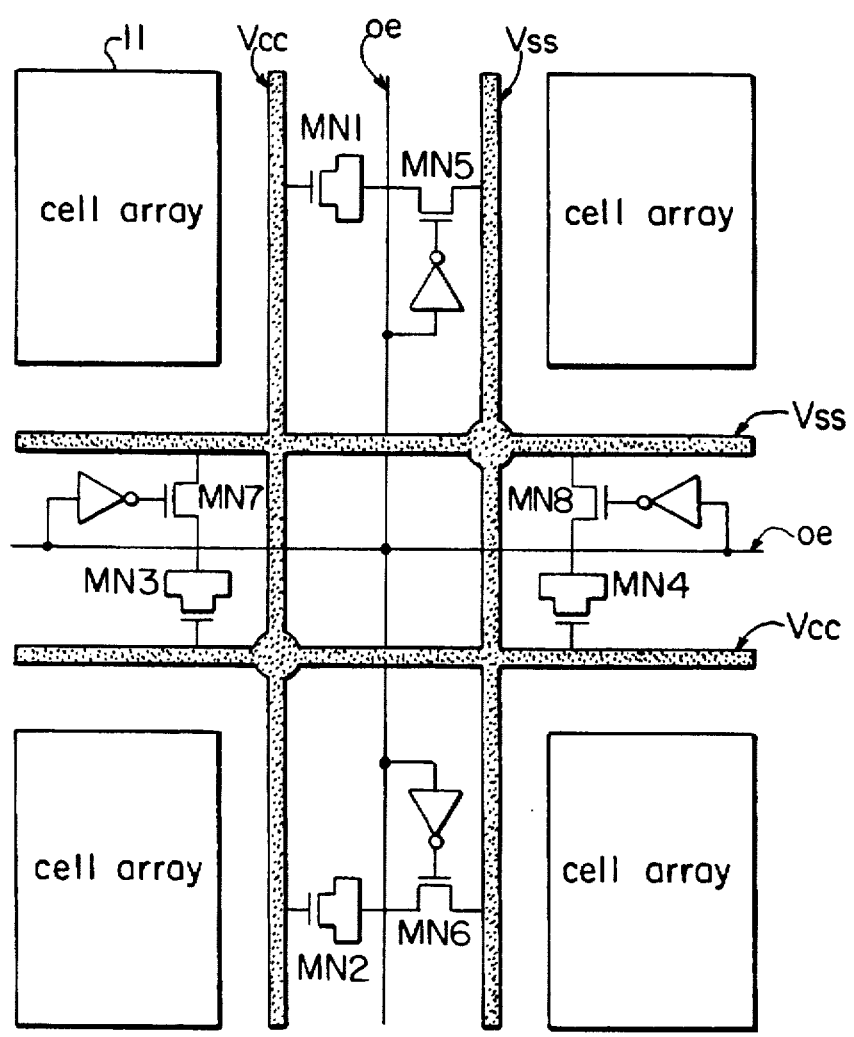
FIG. 3 is a circuit diagram illustrating the construction of a power line coupling prevention circuit for a semiconductor memory device in accordance with an alternative embodiment of the present invention.

FIG. 3 is a circuit diagram illustrating the construction of a power line coupling prevention circuit for a semiconductor memory device in accordance with an alternative embodiment of the present invention. As shown in this drawing, the power line coupling prevention circuit comprises four NMOS transistors MN1–MN4 acting as capacitors. Each of the NMOS transistors MN1–MN4 is selectively connected between a supply voltage line Vcc and a ground voltage line Vss. The power line coupling prevention circuit further comprises four inverters, each of which inverts a data output buffer enable control signal oe, and four NMOS transistors MN5–MN8 acting as switching devices. Each of the NMOS transistors MN5–MN8 is connected between the ground voltage line Vss and a drain-source common connection point of one of the corresponding NMOs transistors MN1–MN4. Also, each of the NMOS transistors MN5–MN8 has a gate for inputting an output signal from one of the corresponding inverters.

The operation of the second embodiment of the present invention is very similar to that of the first embodiment of the present invention and a description thereof will thus be omitted.

The power line coupling prevention circuit of the present invention is applicable to a dynamic random access memory and other semiconductor memory devices with the data output buffer circuit.

As is apparent from the above description, in the conventional power line coupling prevention circuit, the coupling capacitors are directly connected between the supply voltage line Vcc and the ground voltage line Vss. As a result, the voltage level $V_{OL}$ becomes higher due to the coulping copacitators in the read operation.

However, according to the present invention, the connection of the coupling capacitor between the supply voltage line Vcc and the ground voltage line Vss is controlled in the read operation in such a manner that the voltage level on the ground voltage line Vss can be prevented from being increased due to the coupling between the supply voltage line Vcc and the ground voltage line Vss. Therefore, the voltage level $V_{OL}$ can become lower, thereby making the operation of the peripheral circuit stable.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A power line coupling prevention circuit for a semiconductor memory device which has a plurality of memory cell arrays and first and second voltage lines formed between adjacent ones of said memory cell arrays, the power line coupling prevention circuit comprising:

capacitive means formed between said first and second voltage lines; and switching means connected to said capacitive means, for making said capacitive mans conductive;

wherein said switching means is operated in response to a data output buffer enable control signal.

2. A power line coupling prevention circuit for a semiconductor memory device, as set forth in claim 1, wherein, said capacitive means have one side connected to one of said first and second voltage lines and another side connected to said switching means.

3. A power line coupling prevention circuit for a semiconductor memory device, as set forth in claim 2, wherein said capacitive means includes a first MOS transistor.

4. A power line coupling prevention circuit for a semiconductor memory device, as set forth in claim 3, wherein said switching means includes a second MOS transistor having a gate for inputting the data output buffer enable control signal.

5. A power line coupling prevention circuit for a semiconductor memory device, as set forth in claim 3, wherein said switching means includes:

an inverter for inverting the data output buffer enable control signal; and a second MOS transistor having a gate for inputting an output signal from said inverter.

6. A power line coupling prevention circuit for a semiconductor memory device, as set forth in claim 4, wherein said first MOS transistor is an NMOS transistor.

7. A power line coupling prevention circuit for a semiconductor memory device, as set forth in claim 6, wherein said second MOS transistor is a PMOS transistor.

8. A power line coupling prevention circuit for a semiconductor memory device, as set forth in claim 5, wherein said first MOS transistor is an NMOS transistor.

9. A power line coupling prevention circuit for a semiconductor memory device, as set forth in claim 8, wherein said second MOS transistor is an NMOS transistor.

10. A power line coupling prevention circuit for a semiconductor memory device, as set forth in claim 7 or claim 9, wherein said first voltage line is a supply voltage line.

11. A power line coupling prevention circuit for a semiconductor memory device, an set forth in claim 10, wherein said second voltage line is a ground voltage line.

* * * * *